United States Patent [19]

Sakashita et al.

[11] Patent Number: 5,134,707
[45] Date of Patent: Jul. 28, 1992

[54] SATELLITE RECEIVER

[75] Inventors: Seiji Sakashita, Yawata; Hiroaki Ozeki, Neyagawa; Ippei Kanno, Hirakata, all of Japan

[73] Assignee: Matsushita Electric Industrial Co., Ltd., Osaka, Japan

[21] Appl. No.: 600,988

[22] Filed: Oct. 23, 1990

[30] Foreign Application Priority Data

Oct. 26, 1989 [JP] Japan .................................. 1-280551

[51] Int. Cl.$^5$ ............................................ H04B 7/185
[52] U.S. Cl. ................................. 455/3.2; 455/234.1
[58] Field of Search ..................... 455/10, 12, 52, 127, 455/343, 63, 67, 69, 5, 234, 254, 266

[56] References Cited

U.S. PATENT DOCUMENTS 4,777,657 10/1988 Gillaspie ............................ 455/343
4,910,792 3/1990 Takahata et al. ..................... 455/12

FOREIGN PATENT DOCUMENTS 61-72418 4/1986 Japan .

Primary Examiner—Curtis Kuntz
Attorney, Agent, or Firm—Wenderoth, Lind & Ponack

[57] ABSTRACT

Radio waves used in broadcasting and communications making use of broadcasting satellite and communication satellite are FM signals, and the frequency shift and exclusive bandwidth vary depending on the modulation signal. The satellite broadcasting receiver is designed to control the frequency shift so that the amplitude of the demodulation signal is constant, thereby making the bandwidth of the intermediate frequency filter, so as to be capable of receiving using just one filter. At this time, the frequency shift can be controlled continuously, from large to small one, in a predetermined exclusive bandwidth. When further expanding the frequency shift, since the exclusive bandwidth is extended, the noise electric power is increased and the receiving sensitivity is lowered as compared with the exclusive machine. Accordingly, when expanding the frequency shift, the noise bandwidth is narrowed in the PLL demodulator, thereby enhancing the receiving sensitivity.

15 Claims, 12 Drawing Sheets

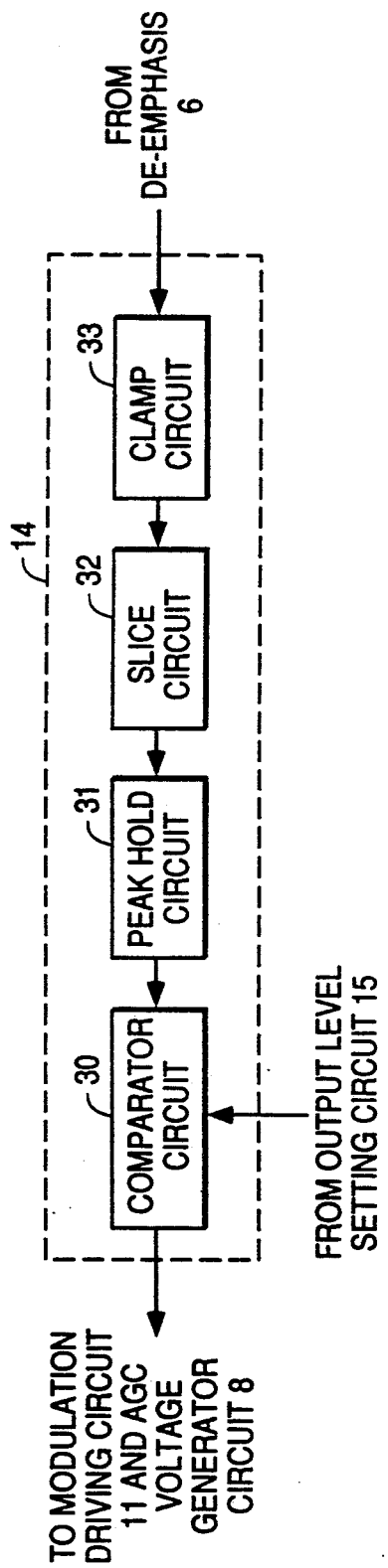
FIG. 4
FIG. 5-a
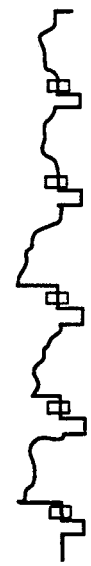
FIG. 5-b
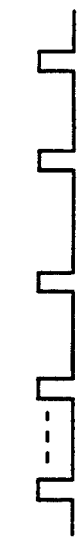
FIG. 5-c
FIG. 5-d

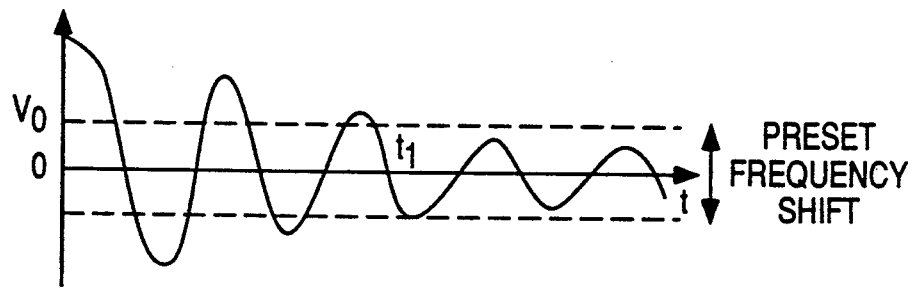
FIG. 16-a
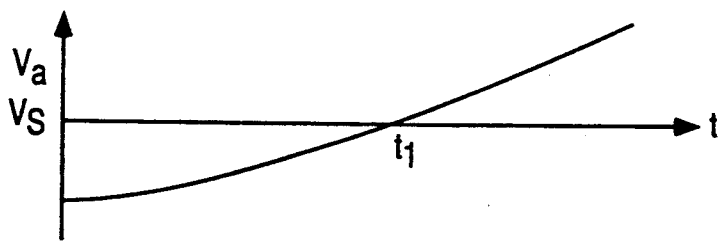
FIG. 16-b
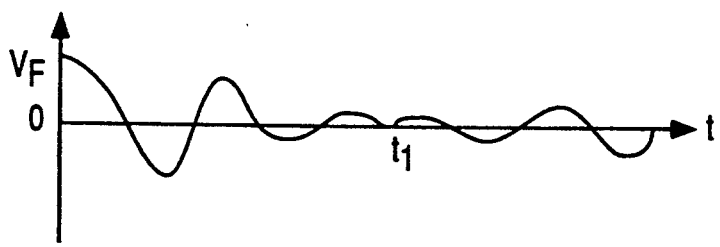
FIG. 16-c

SATELLITE RECEIVER

BACKGROUND OF THE INVENTION

1. Field of the Invention

The present invention relates to a receiver to be used for satellite broadcasting and satellite communication.

2. Description of the Prior Art

Hitherto, receivers for satellite communications were mainly for professional use, and composed of an exclusive receiver for each satellite, Receivers for satellite broadcasting were identical in modulation signal, and broadcasting was received by one receiver.

However, as the demand for satellite transmission increases and the band compression technology has advanced, methods for transmitting high definition signals in the same conventional exclusive bandwidth have been developed and put in practical use. Such examples are transmission systems represented by MUSE systems and MAC systems. As a result, signals differing in the modulation index from the conventional signals have come to mix in the conventional signals. In such situation, the existing receivers are receiving using the same demodulator.

As the number of satellites is increasing every year and broadcasting waves and communication waves are emitted from plural satellites, it is now necessary to select the satellite to receive depending on the purpose. In some of the satellites, the exclusive frequency bandwidth is different from each other, and in order to alter the bandwidth of the intermediate frequency filter in the prestage of the demodulator of the receiver, there were provided as many filters as the number of types of satellites differing in the exclusive bandwidth to be received.

In such conventional satellite broadcasting receivers, it is impossible to receive unless the circuits are added if the number of satellites increases in the future and the exclusive bandwidth varies or the frequency shift is different. If the frequency shift is different, for example, when receiving a signal of the MUSE system from the NTSC system, the amplitude of the demodulation signal differs and the gain of the video signal amplifier circuit must be changed. Or when the bandwidth of the filter is determined by adjusting to the signal of a large frequency shift, the noise electric power is larger as compared with the exclusive receiver adjusted to a signal of small frequency shift, and the sensitivity of the receiver is lowered relatively.

SUMMARY OF THE INVENTION

It is hence a primary object of the invention to present a satellite broadcasting receiver capable of receiving satellites differing in the exclusive bandwidth or frequency shift.

To achieve the above object, a receiver of the invention, when obtaining a demodulation signal by demodulating after converting a received FM signal into an intermediate frequency fixed by an oscillator and a mixer and selecting by one filter, compares the amplitude of the obtained demodulation signal with a preset amplitude, supplies the demodulation signal as a modulation signal to the oscillator to generate an FM signal and compresses the frequency shift by the mixer so that the amplitude of the demodulation signal becomes the same as the preset amplitude. At this time, the frequency shift is done continuously from compression to expansion. When expanding the frequency shift, meanwhile, in order to suppress a sensitivity variation, the demodulation band is limited to lower the noise power and maintain the sensitivity.

In this constitution, the frequency shift of the intermediate frequency becomes constant, and it is possible to select by one filter only, and the demodulation amplitude becomes constant. Furthermore, as the frequency shift is reduced, the filter becomes narrow, and the sensitivity is improved. Besides, as for the frequency expansion, the sensitivity is maintained by limiting the noise of the demodulator. It is also possible to cope with the reception of signals differing in the frequency shift by varying the preset amplitude of the demodulation signal.

BRIEF DESCRIPTION OF THE DRAWINGS

FIG. 4 is a block diagram of an output level comparator circuit for comparing the amplitude of demodulation signal with a preset signal.

FIGS. 5a–5d are diagrams showing the waveform of a signal flowing in an output level comparator circuit.

FIGS. 16a)–16c) are diagrams showing the changes of amplitude and polarity of demodulation signal flowing in a modulation driving circuit.

DESCRIPTION OF THE PREFERRED EMBODIMENTS

Figure 1:
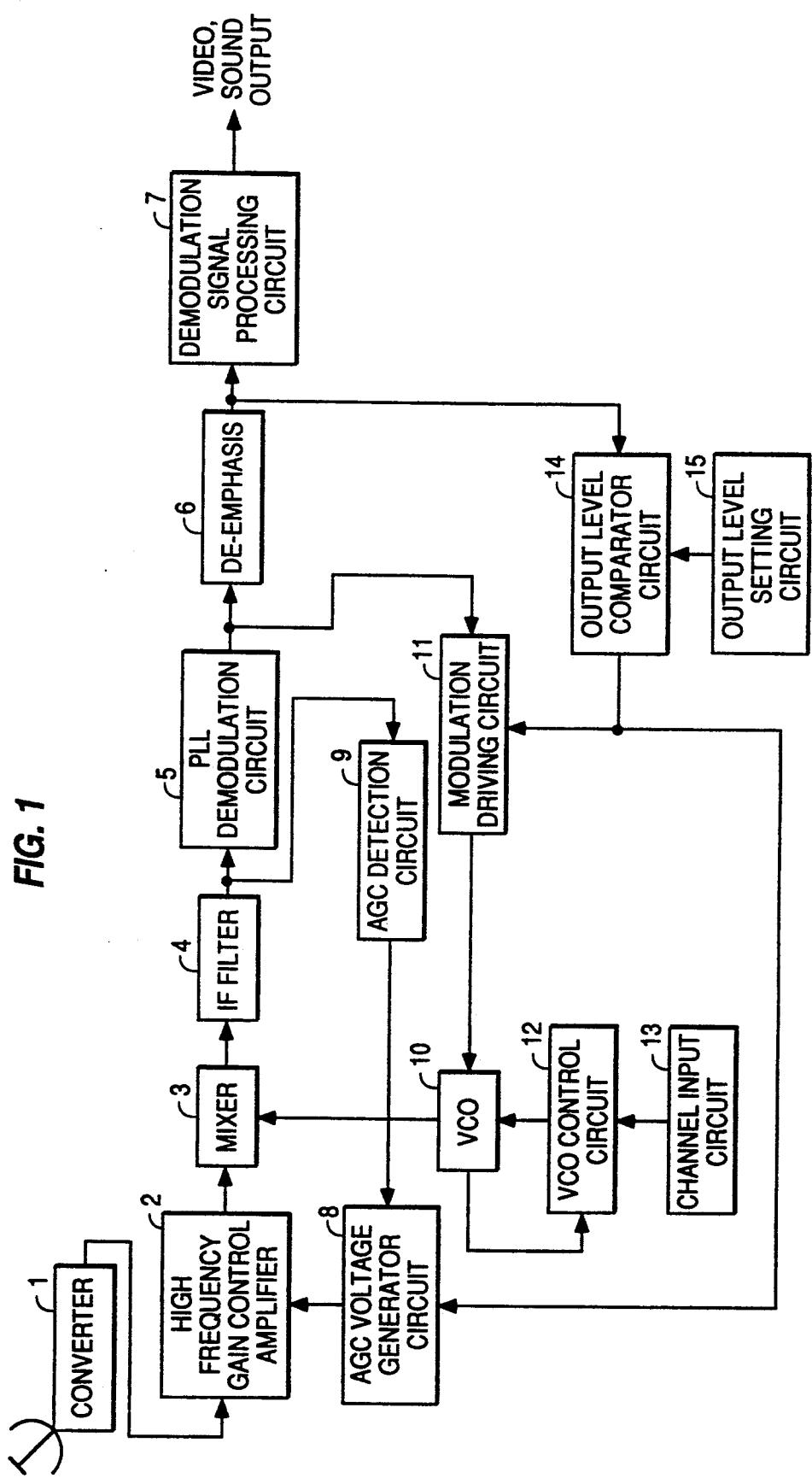
FIG. 1 is a block diagram showing an entire constitution of a satellite broadcasting receiver for receiving satellite signals differing in the modulation index in accordance with a first embodiment of the present invention.

Referring now to the drawings, some of the preferred embodiments of the invention are described in detail below.

FIG. 1 shows the composition of a satellite broadcasting receiver for receiving signals differing in frequency shift. A signal from a satellite is converted from 12 GHz to 1 GHz in a converter 1, and amplified in a high frequency gain control amplifier 2 capable of varying the gain and supplied into a mixer 3. At the mixer 3, it is converted into an intermediate frequency signal by an oscillation signal of VCO 10, and is supplied into a PLL demodulation circuit 5 through an IF filter 4 to synchronize in frequency, thereby obtaining a demodulation signal. The demodulation signal is fed into a de-emphasis circuit 6 to flatten the frequency characteristic, and video signal and sound signal are processed by a demodulation signal processing circuit 7, and are delivered.

The signal after the output from the de-emphasis circuit 6 is supplied into an output level comparator circuit 14, and is compared with the amplitude of the modulation signal determined by an output level setting circuit 15, and the differential voltage is supplied to a modulation driving circuit 11 and AGC voltage generator circuit 8. On the other hand, the output signal of the PLL demodulation circuit 5 is supplied to the modulation driving circuit 11, and the amplitude and polarity of the demodulation signal supplied to the modulation driving circuit 11 are varied depending on the amplitude and polarity of the differential voltage from the output level comparator circuit. This signal varied in amplitude and -polarity is newly supplied to the VCO 10 as a modulation signal, and an FM signal is generated newly, and is supplied into the mixer 3. The mixer 3, in order to operate to generate a frequency difference of the input signal, has the intermediate frequency signal of the output smaller in the frequency shift as compared with the received signal. When the frequency shift of the signal fed to the converter 1 is varied, the above operation is carried out so as to be equal to the amplitude determined by the output level setting circuit 15, and the intermediate frequency bandwidth and demodulation amplitude become constant. If the input signal of the mixer 3 and the modulation polarity of the VCO 10 are identical, the frequency shift is compressed, and if reverse in polarity the frequency shift is expanded. When the frequency shift is expanded, the demodulation signal amplitude is smaller than the preset voltage. When the exclusive bandwidth of the signal is expanded, the noise electric power increases as compared with that in an exclusive receiver, and the sensitivity of the receiver is lowered. At this time, by the signal from the output level comparator circuit 14, the AGC voltage to be supplied to the high frequency gain amplifier 2 is varied and the electric power gain is lowered, and the input level to the PLL demodulator is lowered.

Figure 15:
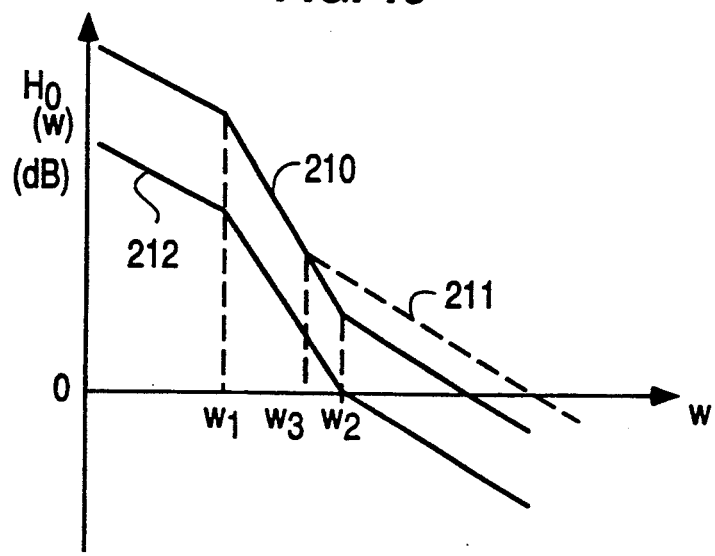
FIG. 15 is a Bode diagram showing an open loop transmission characteristic of PLL circuit.

Consequently, in the ordinary operation for contracting the frequency shift, the open loop characteristic 210 in FIG. 15 becomes an open loop characteristic 212 by the drop of electric power gain of the high frequency gain control amplifier 2, and the operating frequency band is narrowed and the noise electric power can be suppressed, thereby enhancing the sensitivity of the receiver. As a result, although the intermediate frequency band is wider than in the exclusive machine, lowering of the receiving sensitivity is inhibited.

The AGC voltage is converted into a DC voltage by the AGC detection circuit 9 by extracting signal from the prestate of the PLL demodulation circuit, and is supplied into the AGC voltage generator circuit 8.

A channel selection signal is fed into the VC control circuit 12 from a channel input circuit 13, and the VCO 10 presents a channel selection voltage to set to a desired channel. On the other hand, the information showing whether or not the VCO 10 is set to a desired channel is supplied to the VCO control circuit 12. Meanwhile, the signal after PLL demodulation may be supplied directly to the modulation driving circuit 11 and output level comparator circuit 14, but it is easy to detect the level when the waveform of the demodulation signal is shaped, and therefore supply to the output level comparator circuit 14 is done by way of the de-emphasis circuit.

Thus, the satellite broadcasting receiver of the invention is capable of receiving if the frequency shift of the signal from the satellite is different by setting the bandwidth constant. When expanding the frequency shift of the signal of a narrower exclusive bandwidth than the bandwidth of the intermediate frequency filter, the receiving sensitivity is raised so as not to be inferior to that of the conventional exclusive receiver.

Figure 2:
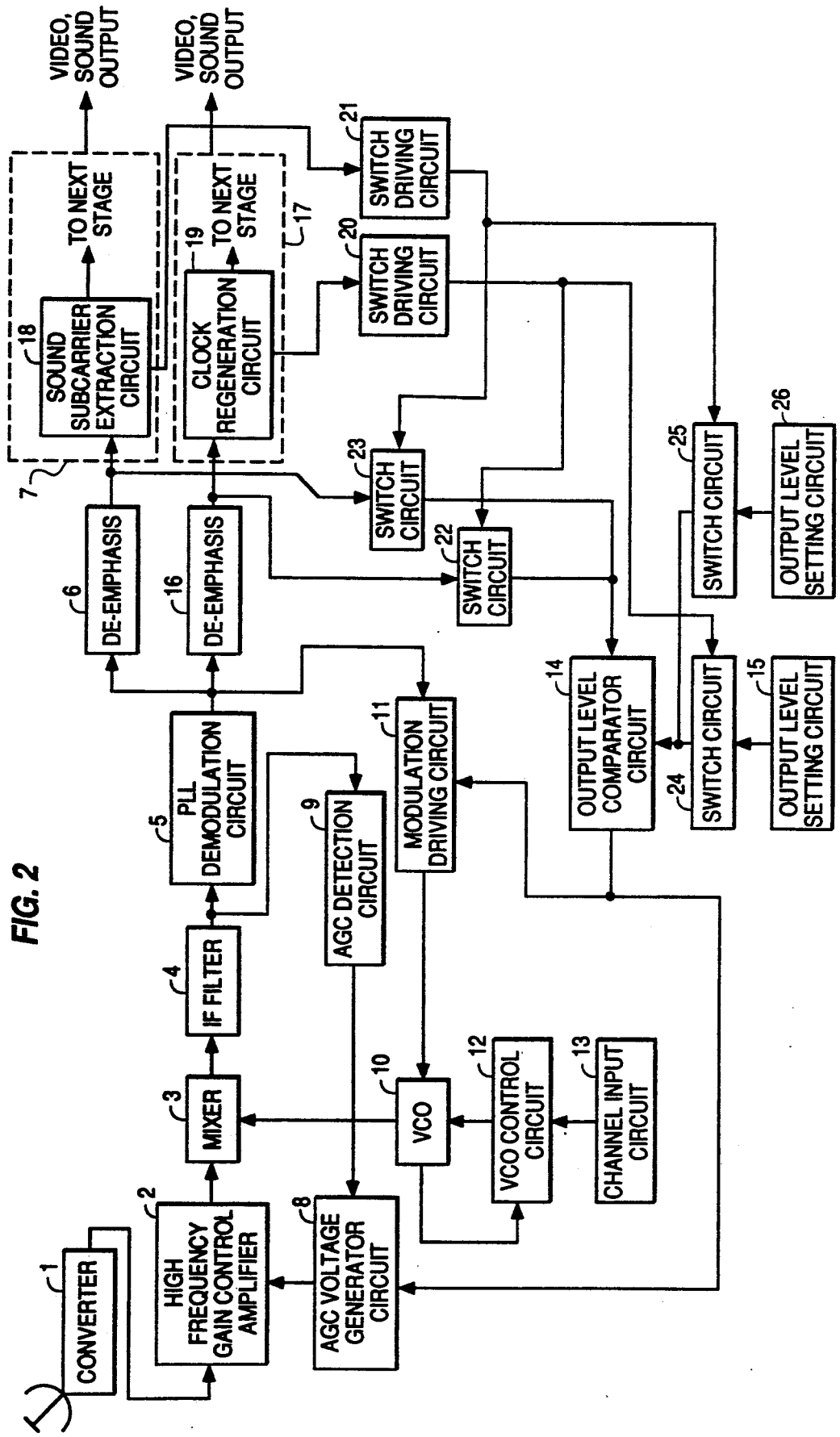
FIG. 2 is a block diagram showing an entire constitution of a satellite broadcasting receiver for receiving satellite signals differing in the modulation signals in accordance with a second embodiment of the present invention.

FIG. 2 shows the construction of a satellite broadcasting receiver differing in the bandwidth of modulation signal and hence different in the frequency shift. A signal from the satellite is converted from 12 GHz into 1 GHz in a converter 1, and amplified by a high frequency gain control amplifier 2 capable of varying the gain, and supplied to a mixer 3. In the mixer 3, it is converted into an intermediate frequency signal by the oscillation signal of the VCO 10, and is supplied into a PLL demodulator circuit 5 through an IF filter 4 to be synchronized in frequency, thereby obtaining a demodulation signal. If the signal received at this time is a modulation signal composed of a video signal of conventional NTSC or PAL system, the demodulation signal is flattened in the frequency characteristic in a de-emphasis circuit 6, and video signal and sound signal are processed and delivered by a demodulaticn signal processing circuit 7. At this time, since the sound is transmitted by a sound subcarrier, a circuit for extracting and demodulating it is required, and this role is played by a sound subcarrier extraction circuit 18. Or when receiving a signal band-compressed in the video signal and sound signal such as of that of a MUSE or MAC system, the demodulation signal from the demodulation circuit 5 is flattened in frequency characteristic in a de-emphasis circuit 16, and the video signal and sound signal are processed and output by a demodulation signal processing circuit 17. At this time, since the image and sound are transmitted as bandcompressed digital signals, to demodulate them, a circuit for regenerating the clock of a system is needed, and a clock regeneration circuit 19 is provided for this purpose.

The demodulation signal after output from de-emphasis circuits 6 and 16 are supplied to an output level comparator circuit 14 through switch circuits 22, 23, respectively, and compared with the amplitude of the demodulation signal set in the output level setting circuits 15 and 16, and the differential voltage is supplied to the modulation driving circuit 11 and AGC voltage generator circuit 8. The output level setting circuits 15 and 26 are set so that the output levels of the demodulation signal processing circuits 7 and 17 are equal. This signal is supplied to the output level comparator circuit 14 through switches 24 and 25. These switches 22 and 24 are operated by a switch driving circuit 20. The switch circuits 23 and 25 are operated by a switch driving circuit 21. When the sound signal is demodulated here by extracting the subcarrier by the subcarrier extraction circuit 18, the signal showing the presence or absence of the signal is fed to the switch circuit 21, and the demodulation signal is supplied to the output level comparator circuit through the switch 23, and an output level setting voltage is supplied through the switch circuit 25. When the clock regeneration circuit 19 regenerates a clock of the system, the signal showing the presence or absence of the signal is fed to the switch circuit 20, and the demodulation signal is fed to the output level comparator through the switch 22, and an output level setting voltage is supplied through the switch circuit 24.

Figure 10:
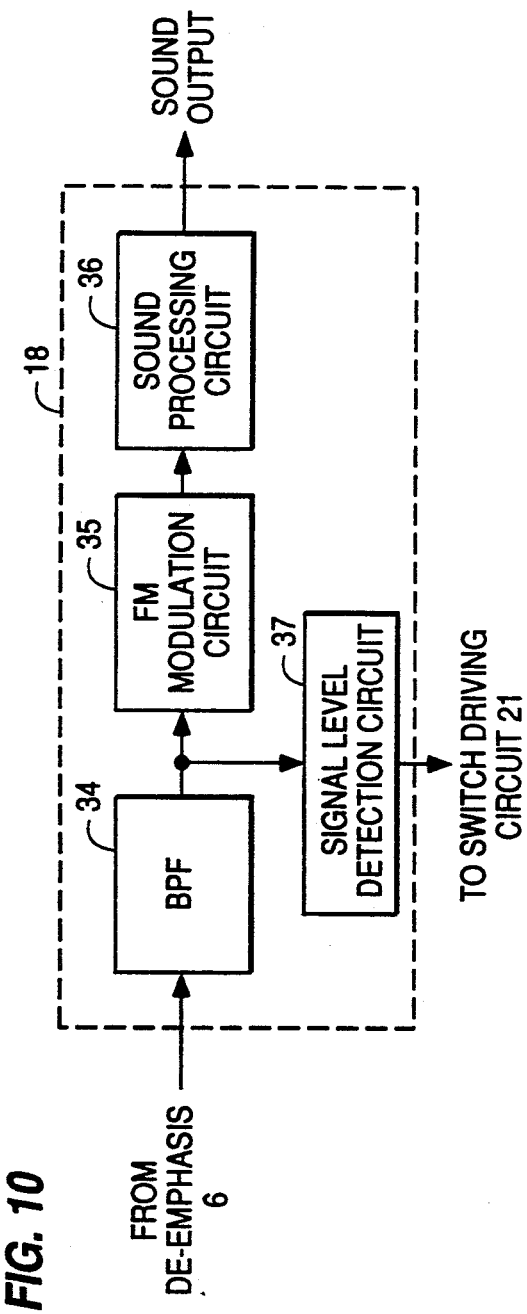
FIG. 10 is a block diagram of a sound carrier extraction circuit when transmitting sound signal by analog frequency modulation.

At this time, when the sound is frequency-modulating the subcarrier, the sound subcarrier extraction circuit 18 is composed as shown in FIG. 10. The output of the de-emphasis circuit 6 passes through BPF 34 for extracting the subcarrier, regenerates a sound signal in an FM demodulation circuit 35, and is de-emphasized and delivered by the sound processing circuit 36. From the output of the BPF 34, the presence or absence of subcarrier is detected by the signal level detection circuit 37, and the results is supplied to the switch driving circuit 21.

Figure 11:
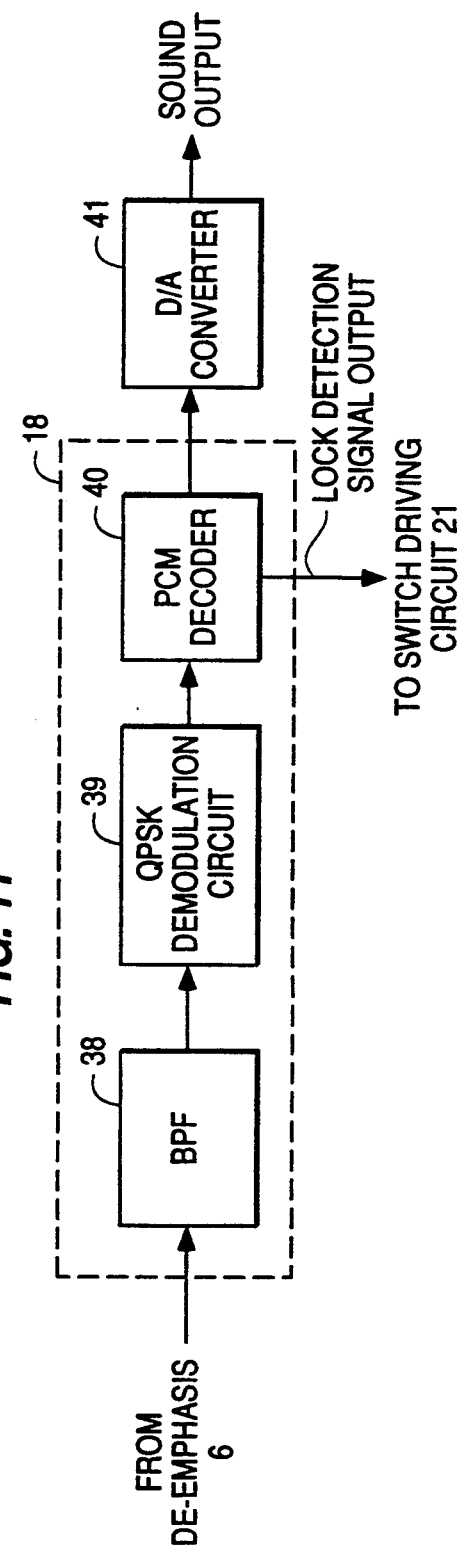
FIG. 11 is a block diagram of a sound carrier extraction circuit when transmitting sound signal by digital modulation.

When the sound is digitally modulating the subcarrier, the sound subcarrier extraction circuit 18 is composed as shown in FIG. 11. The output of the de-emphasis circuit 6 passes through a BPF 38 for extracting the subcarrier, regenerates a sound PCM signal in a QPSK demodulation circuit 39, converts the sound PCM signal into a sound digital signal by a PCM decoder 40, and the sound outputs is delivered through A/D converter 41. A lock detection signal for detecting the state of being locked to the clock of the PCM decoder 40 is delivered to the switch driving circuit 21.

Figure 12:
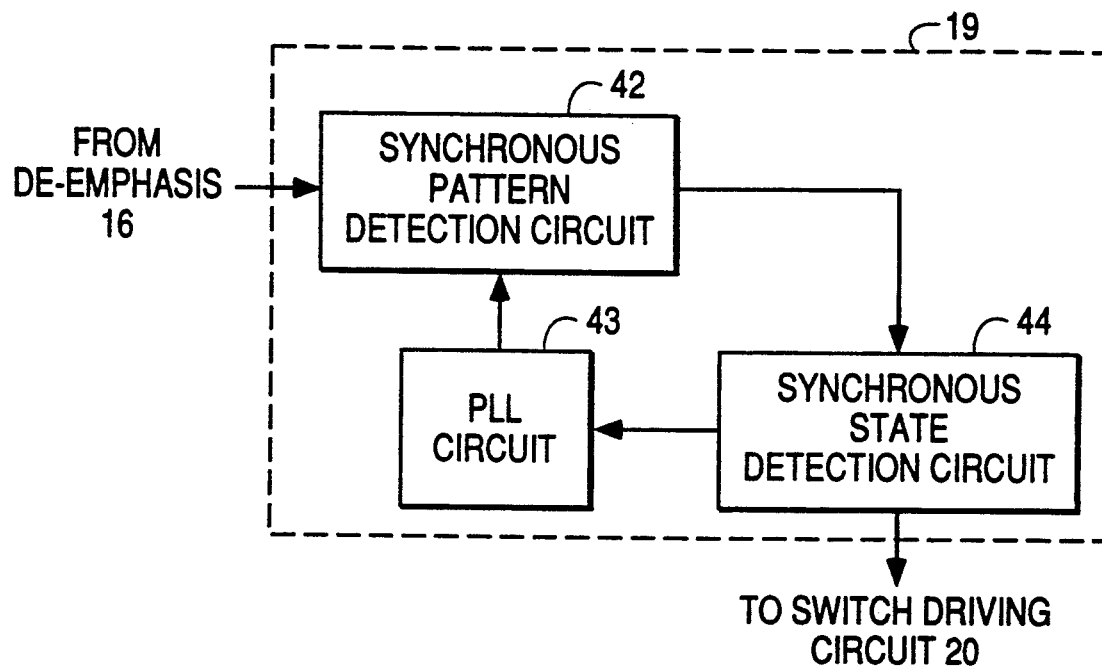
FIG. 12 is a block diagram of a clock regeneration circuit when transmitting video and sound signals by digital demodulation by band compression.

When the video and sound signals are band-compressed digital signals the clock regeneration circuit 19 is composed as shown in FIG. 12. The output of the de-emphasis circuit 16 searches the synchronous pull-in pattern in the synchronous pattern detection circuit 42, compares the phase in the PLL circuit 43, and the frequency of the PLL is matched with the clock of the system, and at this time the lock state is supplied from the synchronous pattern detection circuit 42 to the synchronous state detection circuit 44, and this signal is supplied to the switch driving circuit 20.

Figure 13:
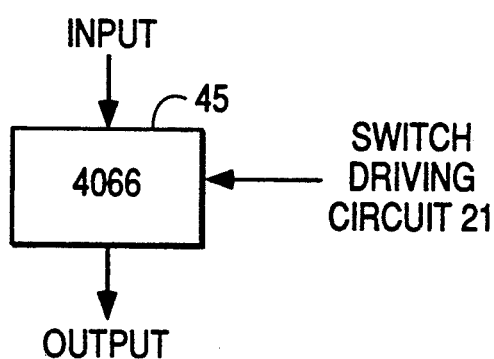
FIG. 13 is a constitutional drawing of a switch circuit.

At this time, the switch circuit is composed of analog switch 45 (CMOS-IC 4066) as shown in FIG. 13. Or it is enough as far as the same function is provided.

On the other hand the output signal of the PLL demodulation circuit 5 is supplied to the modulation driving circuit 11, and the amplitude and polarity of the demodulation signal supplied to the modulation driving circuit 11 are varied depending on the amplitude and modulation of the differential voltage from the output level comparator circuit. This signal varied in amplitude and polarity is newly supplied as modulation signal to the VCO 10, and an FM signal is newly generated, and is supplied to the mixer 3. The mixer 3 operates to generate a frequency difference of the input signals, and therefore the intermediate frequency signal of the output is smaller in the frequency shift as compared with the received signal. When the frequency shift of the signal entering the converter 1 changed, the above operation is carried out so as to be equal to the amplitude determined in the output level setting circuit 15, and the intermediate frequency bandwidth and the demodulation amplitude become constant. If the input signal of the mixer 3 and the modulation polarity of the VCO 10 are the same, the frequency shift is compressed, and if reversed in polarity the frequency shift is expanded. When the frequency shift is expanded, the demodulation signal amplitude is smaller than that of the set voltage. When expanding the exclusive bandwidth of this signal, as compared with the case of an exclusive receiver, the noise electric power increases, and hence the sensitivity of the receiver is lowered. At this time, by the signal from the output level comparator circuit 14, the AGC voltage to be supplied to the high frequency gain amplifier 2 is varied to lower the electric power gain, thereby lowering the input level to the PL demodulator.

Consequently, in the ordinary operation for contracting the frequency shift, the open loop characteristic 210 in FIG. 15 becomes the open loop characteristic 212 by the drop of electric power gain of the high frequency gain control amplifier 2, and the operating frequency width becomes narrow and the noise electric power can be suppressed, so that the sensitivity of the receiving may be enhanced. As a result, although the intermediate frequency band, is wider than of the exclusive receiver, the lowering of the receiving sensitivity is suppressed.

The AGC voltage is converted into a DC voltage by the AGC detection circuit 9 by extracting the signal from the prestate of the PLL demodulation circuit, and is supplied to the AGC voltage generator circuit 8.

A channel selection signal from the channel input circuit 13 is supplied to the VCO control circuit 12, and the channel selection voltage is set in, the VCO, 10 to set to a desired channel. The information as to whether or not the VCO 10 is set in a desired channel is supplied to the VCO control circuit 12.

The signal after PLL demodulation may be directly supplied to the modulation driving circuit 11 and output level comparator circuit 14, but it is easier to detect the level by shaping the waveform of the demodulation signal, and hence the supply to the output level comparator circuit 14 is made through a de-emphasis circuit.

Thus, in the satellite broadcasting receiver of the present invention, even if type of the signal from the satellite is different, it is possible to receive by keeping the bandwidth constant. When expanding the frequency shift of the signal in the exclusive bandwidth narrower than the bandwidth of the intermediate frequency filter, the receiving sensitivity is enhanced so as not to be inferior t that of the existing exclusive receiver.

Figure 3:
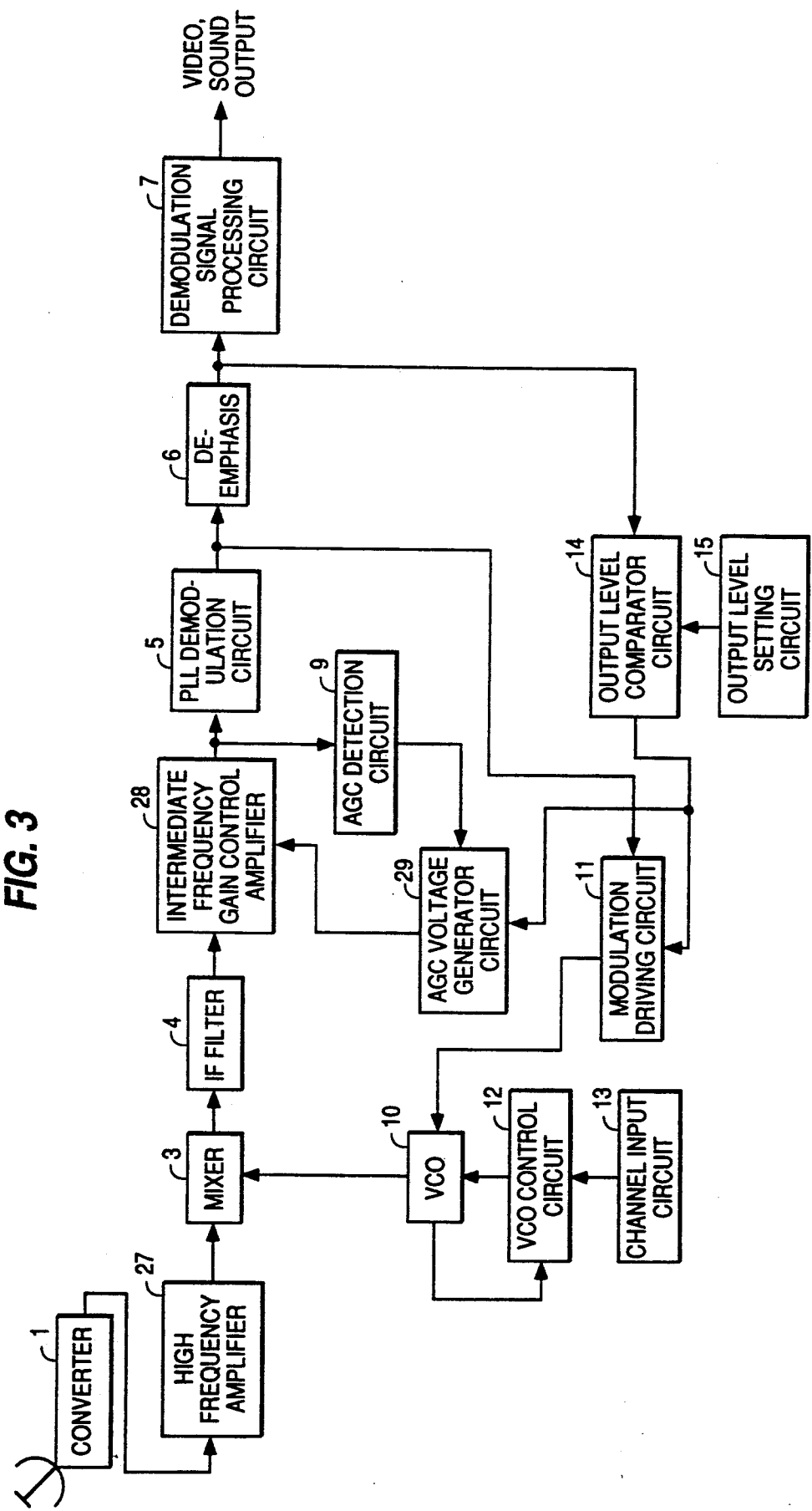
FIG. 3 is a block diagram showing an entire constitution of a satellite broadcasting receiver having an AGC composed of an intermediate frequency amplifier in accordance with a third embodiment of the present invention.

FIG. 3 shows the construction of a satellite broadcasting receiver for receiving signals differing in frequency shift. A signal from a satellite is converted from 12 GHz into 1 GHz in a converter 1, and amplified by a high frequency amplifier 27 capable of varying the gain, and is supplied to a mixer 3. In the mixer 3, by the oscillation signal from a VCO 10, it is converted into an intermediate frequency signal, and is amplified in an intermediate frequency gain control amplifier 28 by way of an IF filter 4, and is supplied into a PLL demodulation circuit 5 to be synchronized in frequency thereby obtaining a demodulation signal. The demodulation signal is flattened in the frequency characteristic by a de-emphasis circuit 6, and video signal and sound signal are processed and delivered by a demodulation signal processing circuit 7.

The signal after the output from the de-emphasis circuit 6 is supplied into an output level comparator circuit 14, and is compared with the amplitude of the demodulation signal set by an output level setting circuit 15, and the differential voltage is supplied to a modulation driving circuit 11 and an AGC voltage generator circuit 8. On the other hand, the output signal of the PLL demodulation circuit 5 is supplied t the modulation driving circuit 11, and the amplitude and polarity of the demodulation signal supplied to the modulation driving circuit 11 are varied depending on the amplitude and polarity of the differential voltage from the output level comparator circuit. This signal varied in amplitude and polarity is newly supplied as a modulation signal to the VCO 10, and an FM signal is newly generated and is supplied to the mixer 3. The mixer 3 generates a frequency difference of the input signal, and hence the output intermediate frequency signal is smaller in the frequency shift as compared with the received signal. When the frequency shift of the signal entering the converter 1 varies, the above operation is conducted so as to be equal to the amplitude set by the output level setting circuit 15, and the intermediate frequency bandwidth and the demodulation amplitude become constant. If the input signal of the mixer 3 and the modulation polarity of the VCO 10 are the same, the frequency shift is compressed, and if reversed in polarity the frequency shift is expanded. When the frequency shift is expanded, the demodulation signal amplitude is smaller than the set voltage. When expanding the exclusive bandwidth of this signal, as compared with the case of the exclusive receiver, the noise electric power increases, and hence the sensitivity of the receiver is lowered. At this time, by the signal from the output level comparator circuit 14, and AGC voltage to be supplied to the intermediate frequency gain amplifier 28 is varied to lower the electric power gain, thereby lowering the input level to the PLL demodulator. As a result, in the ordinary operation for contracting the frequency shift, the open loop characteristic 210 in FIG. 15 becomes the open loop characteristic 212 by the drop of electric power gain of the high frequency gain control amplifier 2, and the operating frequency width becomes narrow to suppress the noise electric power, hence enhancing the sensitivity of the receiver. Accordingly, although the intermediate frequency width is broader than in the exclusive machine, the lowering of the receiving sensitivity is inhibited.

The AGC voltage is converted into a DC voltage by the AGC detection circuit 9 by extracting signal from the prestage of the PLL demodulation circuit and is supplied into the AGC voltage generator circuit 8.

A channel selection signal is fed into the VCO control circuit 12 from a channel input circuit 13, and the VCO 10 presents a channel selection voltage to set to a desired channel. On the other hand, the information showing whether or not the VCO 10 is set to a desired channel or not is supplied to the VCO control circuit 12. Meanwhile, the signal after PLL demodulation may be supplied directly to the modulation driving circuit 11 and output level comparator circuit 14, but it is easy to detect the level when the waveform of the demodulation signal is shaped, and the signal is therefor supplied to the output level comparator circuit 14 by way of the de-emphasis circuit.

Thus, the satellite broadcasting receiver of the invention is capable of receiving if the frequency shift of the signal from the satellite is different by setting the bandwidth constant. When expanding the frequency shift of the signal of a narrower exclusive bandwidth than the bandwidth of the intermediate frequency filter, the receiving sensitivity is raised so as not to be inferior to that of the conventional exclusive receiver.

FIG. 4 is a block diagram of an output level comparator circuit 14 of the satellite broadcasting receiver of the present invention. The demodulation signal entering from a de-emphasis circuit 6 is free of DC component as shown in FIG. 5a, and therefore the amplitude is determined mainly by the average voltage of the demodulation signal. Accordingly, through a clamp circuit 33, the pedestal level of the video signal is kept at a specific potential as shown in FIG. 5b. Afterwards, the video portion is cut off by a slice circuit 32 to leave only the synchronous signal as shown in FIG. 5c, which is supplied to a peak hold circuit 31. Since the amplitude of this synchronous signal is proportional to the frequency shift of the received FM signal, by detecting this voltage, the frequency shift may be kept constant. This output is fed to a comparator circuit 30, and is compared with the set voltage supplied from an output level setting circuit 15, and the result is supplied into a modulation driving circuit 11 and AGC voltage generator circuit 8. At this time, the voltage waveform of the demodulation signal entering the comparator circuit is holding the peak of the synchronous signal, and therefore it is as shown in FIG. 5d.

Figure 6:
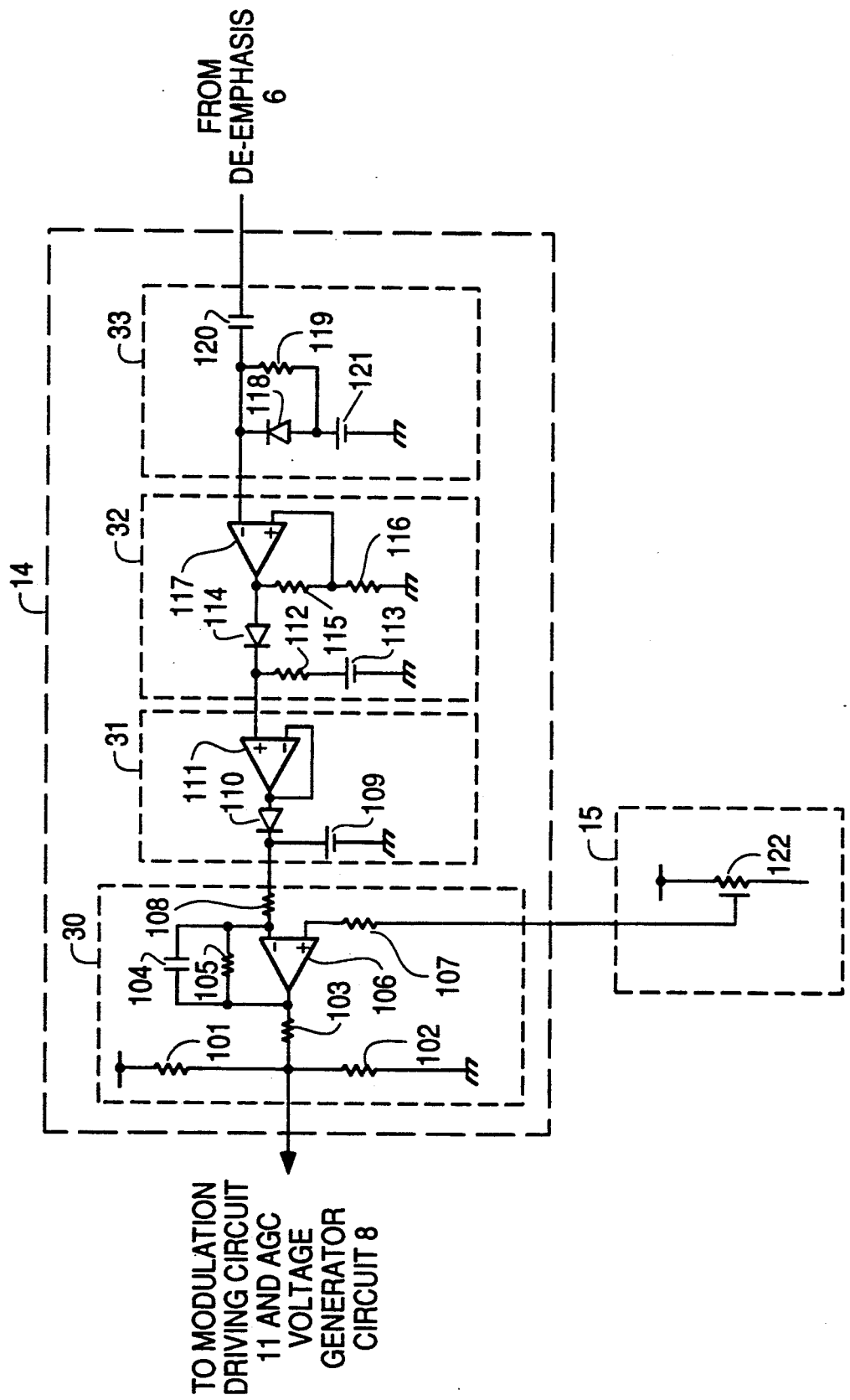
FIG. 6 is a diagram showing the circuit composition of the output level comparator circuit.

FIG. 6 is an example of a practical circuit composition of the output level comparator circuit 14 explained in FIG. 4. The demodulation signal from the de-emphasis circuit 6 enters the clamp circuit 33, and when the signal becomes higher than the DC potential 121 through a DC blocking capacitor 120, a diode 118 is made nonconductive, and the signal is transmitted to the next stage. When becoming lower, to the contrary, the diode 118 does not conduct and only a specific voltage is transmitted, the signal is supplied to the slice circuit 32 in the next stage. The signal amplified by an amplifier 117 of which amplification factor is determined by resistances 115, 116 can pass only if higher than the potential determined by the DC potential 113 because the diode 114 conducts, while the lower signals are cut off. The resistance 112 is load resistance. Afterwards, it is supplied to the peak hold circuit 31. Here, from the buffer 111 to the diode 110 and capacitor 109, the peak hold voltage is held and is fed into the comparator circuit 30. The signal enters the comparator 106 through resistance 108, while the se voltage supplied from the output level setting circuit 15 enters the other terminal of the comparator 106 to compare, and the result is supplied to the modulation driving circuit 11 and AGC voltage generator circuit 8. Here, resistances 108, 105, 103, 107, 101, and 102 are bias resistances for determining the operating range of the comparison output.

The output level setting circuit 15 is composed of variable resistor 122. Here, however, as long as generating DC potential, the potential may be generated by sending a code of set voltage a D/A converter.

Figure 7:
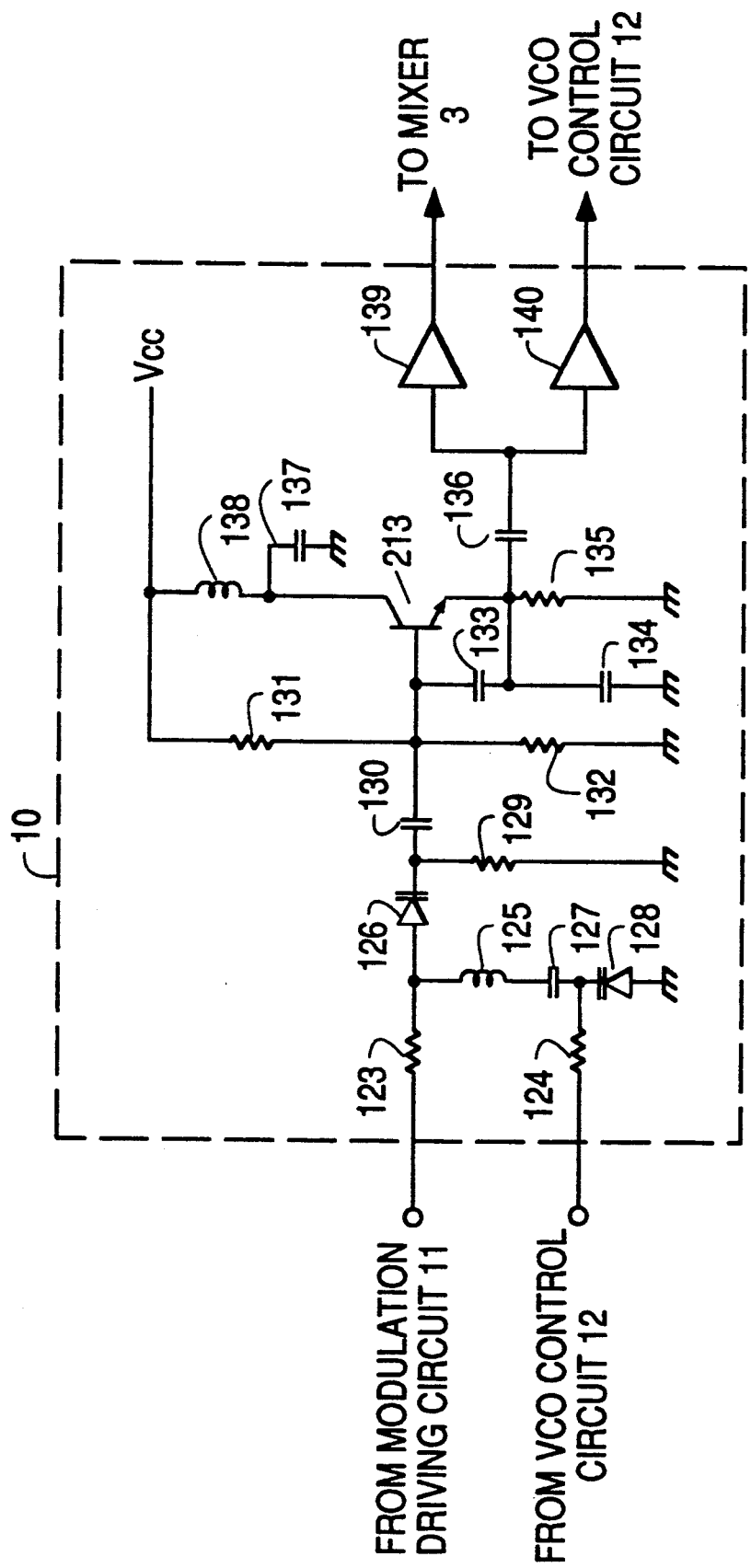
FIG. 7 is a diagram showing the circuit composition of an oscillator.

FIG. 7 shows an embodiment of the VCO 10 of satellite broadcasting receiver of the present invention. The VCO 10 is a trap oscillator composed of transistor 213, resistances 135, 131, and 132, capacitors 133, 134, 136, and 137, and choke coil 138. Since the channel selection action is required, a channel selection voltage is supplied from the VCO control circuit 12 to the varactor diode 128 through the resistance 124. On the other hand, the signal for obtaining FM modulation wave from the modulation driving circuit 11 is supplied to the varactor diode 126 through resistance 123. The oscillation frequency is determined by the input admittance of the varactor diodes 126 and 128 and coil 125, and capacitors 133, 134, and 136 and transistor 213. As a result, the oscillation signal is supplied to the VCO control circuit 12 again for monitoring the mixer 3 and channel selection frequency through the buffers 139 and 140.

Figure 8:
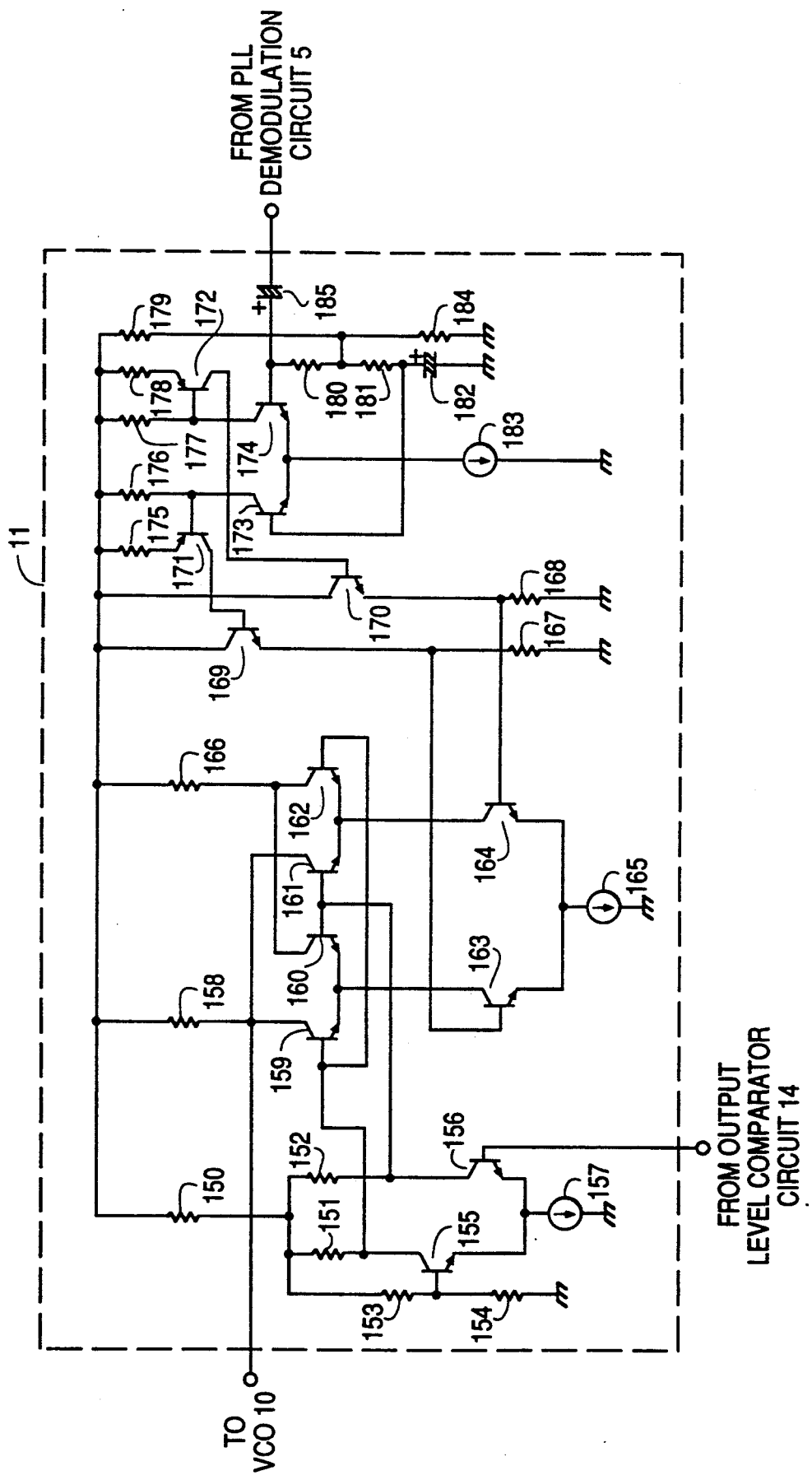
FIG. 8 is a diagram showing the circuit composition of a modulation driving circuit.

FIG. 8 is an embodiment of a practical composition of the modulation driving circuit of the satellite broadcasting receiver of the present invention. The demodulation signal entering from the PLL demodulation circuit 5 is supplied to a differential amplifier composed of transistors 173 and 174 and constant current source 183 through a DC blocking capacitor 185, and signals mutually reverse in phase are generated from the collector electrodes of the transistors 173 and 174. These signals are fed to the base electrodes of the transistors 163 and 164 through the buffer transistors 171, 172, 170 and 169. At this time, the resistances 179, 184, 180 and 181 are bias resistances, and the resistances 167, 168, 175, 176, 177, and 178 are load resistances. The capacitor 182 is for AC grounding.

The transistors 159, 160, 161, 162, 163 and 164 are of double balance composition, making up a multiplier. On the other hand, the comparison result voltage entering from the output level comparator circuit 14 is supplied to the differential amplifier composed of transistors 155 and 156 and constant current source 157, and signals mutually reverse in phase are supplied to the collector electrodes of these transistors Here, the resistances 153 and 154 are bias resistances, and the resistances 151, 152 and 150 are load resistances. The signal is supplied to the transistors 159, 160, 161 and 162, and the base electrodes.

In the load resistances 158 and 166, by the signal level as a result of comparison of output level, signals reverse in phase of the demodulation signal are mutually synthesized, and hence the phase and amplitude vary. This output is supplied to the VCO 10.

The signal waveforms at this time are shown in FIGS. 16a)-16c). In the diagram, FIG. 16a) a refers to the signal taken out of the PLL demodulation circuit 5, and it shows that the frequency shift becomes smaller as the time passes to become the preset frequency shift at time t1. FIG. 16b) shows a comparison result signal composed by level comparison of the demodulation signal. These two signals are supplied in the multiplier to produce the signal shown in FIG. 16c) in which the phase is reverse from time t1 and the frequency shift is expanded.

Figure 9:
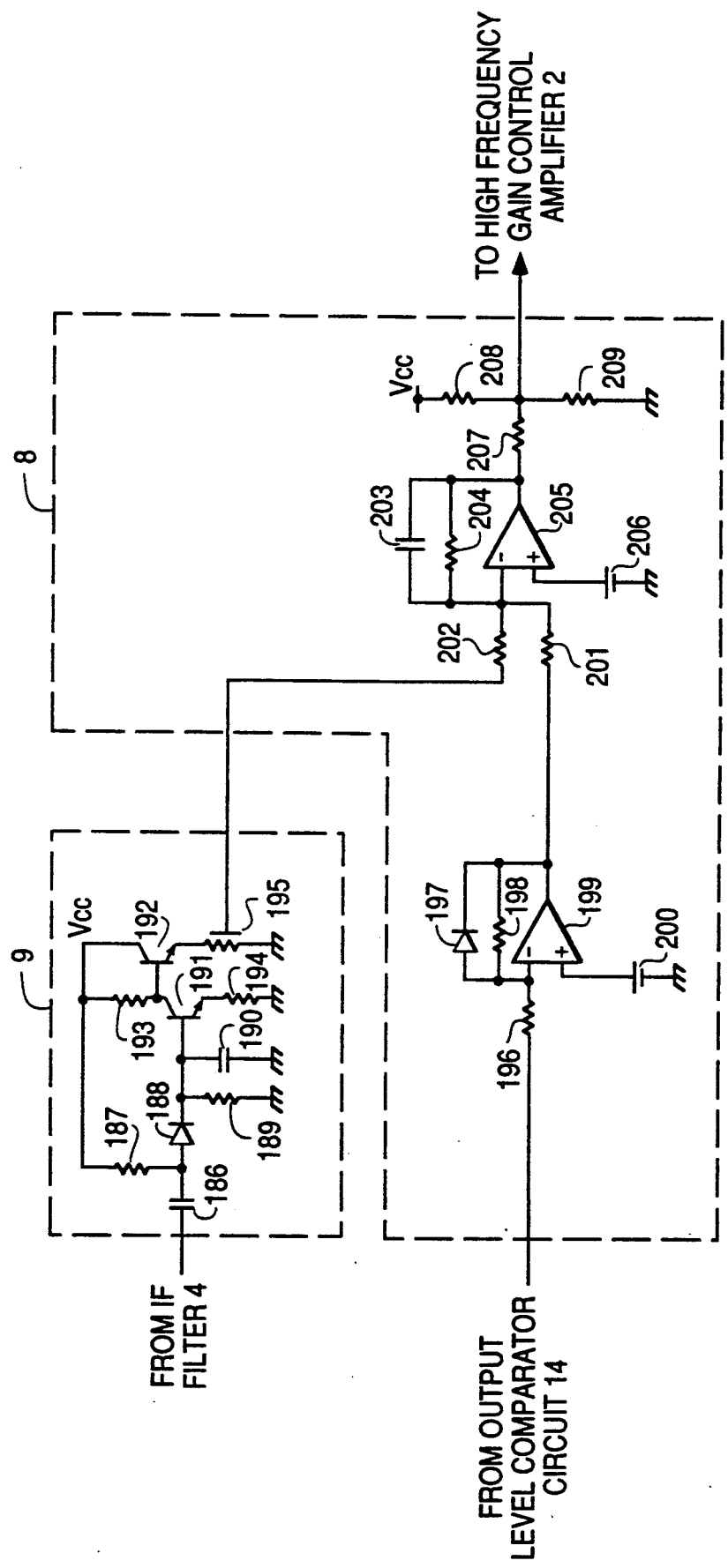
FIG. 9 is a diagram showing the circuit composition of an AGC voltage generator circuit.

FIG. 9 is an embodiment of practical circuits of AGC voltage generator circuit 8 and AGC detection circuit 9 of the satellite broadcasting receiver of the invention. The intermediate frequency signal entering from a IF filter 4 is detected by a diode 188 through a DC blocking capacitor 186 and is smoothed by a capacitor 190, and is supplied to the AGC voltage generator circuit through buffer transistors 191 and 192. The resistances 187, 189, 193, 194 and 195 are bias resistances.

Figure 14:
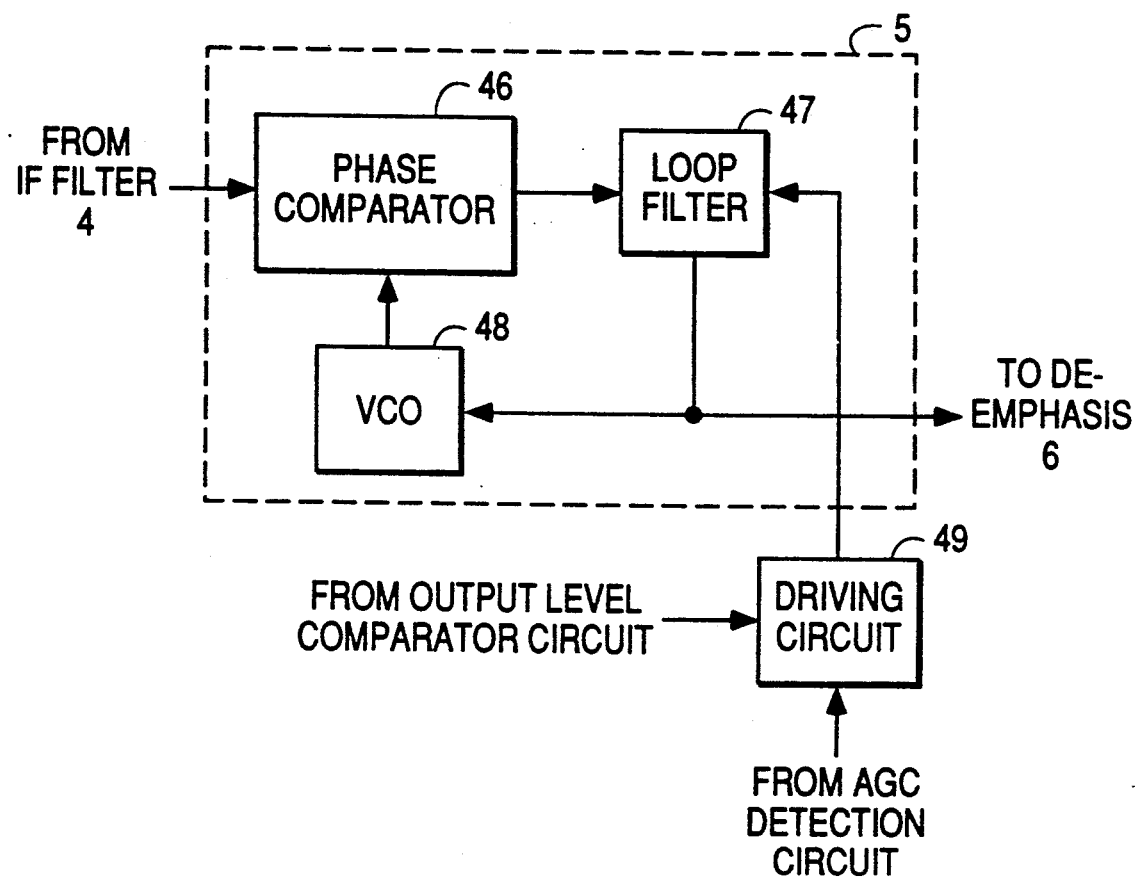
FIG. 14 is a diagram showing a PLL circuit for composing a demodulation circuit.

On the other hand, the comparison result voltage entering from the output level comparator circuit 14 is amplified by an amplifier 199 of which amplification is determined by the resistances 196 and 198. At this time, the diode 197 is used to limit so as not to be lower than the potential determined by the reference potential 200. Afterwards it enters the adder 205. Here, the amplification factor is varied by the ratio of the resistances 202, 201 and 204, and the amount of addition varies. The resistances 208, 207, and 209 are resistances for limiting the amplitude. The reference potential 206 determines the center voltage of the output potential. By synthesizing these two signals, the AGC by electric field intensity and operation of input level decrease to PLL demodulator when expanding the frequency shift may be effected FIG. 14 is an embodiment in which the function of decrease of input level to the PLL demodulator when expanding the frequency shift is realized by decrease o the demodulation bandwidth directly by the PLL demodulator. The driving circuit 49 having the function of an AGC voltage generator circuit 8 moves between the positions of the poles of the loop filter 47 composing the PLL demodulator to narrow the modulation bandwidth, thereby reducing the noise electric power. As shown in FIG. 15, the pole position of the open loop characteristic 210 is changed from $\omega 2$ to $\omega 3$, and the bandwidth is narrowed. The PLL demodulator is composed of phase comparator 46, VCO 48 and loop filter 47, and when synchronized with the signal entering from the IF filter in phase, the demodulation signal can be taken out from the output of the loop filter 47.

What is claimed is:

1. A satellite broadcasting receiver for converting an FM signal into a fixed intermediate frequency by a mixing circuit also having an oscillation circuit connected thereto, demodulating the fixed intermediate frequency in a demodulation circuit after passing it through one filter, and delivering a signal from a demodulation signal processing circuit operatively connected to an output of the demodulation circuit, comprising:

an output level setting means for setting a predetermined amplitude of the demodulation signal;

a comparing means for comparing the amplitude of the demodulation signal with the predetermined amplitude;

a modulation driving means for supplying the demodulation signal to the oscillation circuit while continuously changing the amplitude and polarity of the demodulation signal in response to an output of the comparing means; and an AGC voltage generating means for generating an AGC voltage for controlling the input level to the demodulator according to the polarity of the demodulation signal supplied to the oscillation circuit.

2. A satellite broadcasting receiver of claim 1, wherein:

the comparing means comprises: a means for clamping the demodulation signal; a means for slicing a part of the amplitude voltage; a means for holding the peak voltage of the amplitude, and a means for comparing the held peak voltage with a preset voltage.

3. A satellite broadcasting receiver of claim 1, wherein:

the modulation driving means comprises a means for producing differential voltages which are in phase with and opposite phase from the demodulation signal, and a means for determining a synthetic ratio of the in-phase and opposite-phase differential voltages according the output from the comparing means.

4. A satellite broadcasting receiver of claim 1, wherein:
the AGC voltage generating means synthesizes an AGC detection voltage and the output from the comparing means.

5. A satellite broadcasting receiver of claim 4, wherein:
the AGC voltage generating means supplies a control voltage to a high frequency amplifier provided before the mixing circuit.

6. A satellite broadcasting receiver of claim 4, wherein:
the AGC voltage generating means supplies a control voltage to an intermediate frequency amplifier disposed after the mixing circuit.

7. A satellite broadcasting receiver of claim 1, wherein:
the output level setting means varies the preset amplitude according to a difference of the received modulation signal.

8. A satellite broadcasting receiver of claim 1, wherein:
at least one additional demodulation signal processing circuit is provided depending on a difference of the received modulation signal, said additional processing circuit being also operatively connecting an output of the demodulation circuit and delivering a signal which is different from the signal provided by the demodulation signal processing circuit.

9. A satellite broadcasting receiver of claim 8, further comprising a switch driving circuit for detecting a part of the demodulation signals from the demodulation signal processing circuits and for generating a switch changeover signal.

10. A satellite broadcasting receiver of claim 9, further comprising switch circuits disposed in the outputs of the demodulation circuits and in the output of the output level setting means, and when a desired demodulation signal is obtained, changeover action is effected by a driving signal from the switch driving circuit 11. A satellite broadcasting receiver of claim 8, wherein:
the demodulation signal processing circuit processes the conventional video signal and the analog frequency modulation sound carrier.

12. A satellite broadcasting receiver of claim 11, wherein:
the demodulation signal processing circuit generates a signal to the switch driving circuit depending on the amplitude level of the sound carrier.

13. A satellite broadcasting receiver of claim 8, wherein:
the demodulation signal processing circuit processes the conventional video signal and digital phase modulation sound carrier.

14. A satellite broadcasting receiver of claim 13, wherein:
the demodulation signal processing circuit generates a signal to the switch driving circuit by clock synchronization of the digital sound.

15. A satellite broadcasting receiver of claim 8, wherein:
the demodulation signal processing circuit processes the band-compressed video and sound signals.

* * * * *